US009226385B2

(12) United States Patent
Brown et al.

(10) Patent No.: US 9,226,385 B2
(45) Date of Patent: Dec. 29, 2015

(54) LINE ISOLATION OF RADIO FREQUENCY DEVICES

(71) Applicant: Raytheon Company, Waltham, MA (US)

(72) Inventors: Andrew K. Brown, Hesperia, CA (US); Shane A. O'Connor, Rancho Cucamonga, CA (US)

(73) Assignee: RAYTHEON COMPANY, Waltham, MA (US)

( * ) Notice: Subject to any disclaimer, the term of this patent is extended or adjusted under 35 U.S.C. 154(b) by 476 days.

(21) Appl. No.: 13/678,993

(22) Filed: Nov. 16, 2012

(65) Prior Publication Data
US 2014/0139300 A1   May 22, 2014

(51) Int. Cl.
*H05K 1/02* (2006.01)
*H01P 3/08* (2006.01)
*H01P 11/00* (2006.01)
*H01P 1/203* (2006.01)

(52) U.S. Cl.
CPC .............. *H05K 1/0216* (2013.01); *H01P 3/081* (2013.01); *H01P 1/20363* (2013.01); *H01P 11/002* (2013.01)

(58) Field of Classification Search
CPC ... H01P 3/081; H01P 1/20363; H01P 11/002; H05K 1/0216
USPC ......... 333/4, 5, 236, 238, 246, 156, 161, 164, 333/202, 203, 204, 205, 12
See application file for complete search history.

(56) References Cited

U.S. PATENT DOCUMENTS 5,160,905 A * 11/1992 Hoang ........................... 333/204
5,977,847 A * 11/1999 Takahashi ..................... 333/204
6,950,590 B2    9/2005 Cheung et al.

* cited by examiner

*Primary Examiner* — Robert Pascal
*Assistant Examiner* — Jorge Salazar, Jr.
(74) *Attorney, Agent, or Firm* — Cantor Colburn LLP

(57) ABSTRACT

A radio frequency (RF) device includes a transmission line arranged on a substrate, the transmission line operative to propagate an RF signal having a wavelength ($\lambda$), and a first isolation portion arranged on the substrate proximate to the transmission line, the first isolation portion including an arrangement of stubs, where each stub of the arrangement of stubs has a length (y) where $y=\frac{1}{4}\lambda$, the first isolation portion operative to substantially prevent electromagnetic interference caused by the propagation of the RF signal in the transmission line from passing through the first isolation portion.

20 Claims, 11 Drawing Sheets

US 9,226,385 B2

LINE ISOLATION OF RADIO FREQUENCY DEVICES

BACKGROUND

The present disclosure relates to radio frequency devices, and more specifically, to apparatus and methods for isolating transmission lines in radio frequency (RF) devices.

Radio frequency devices may include one or more transmission lines arranged on a substrate that are operative to propagate RF signals. The RF signals may cause interference in the devices if the transmission lines are not properly isolated from other transmission lines, integrated circuitry, or other features arranged on the substrate.

FIG. 1 illustrates top view partially cut-away view of a prior art example of a portion of an RF device arranged on a substrate 100. The illustrated example includes transmission lines 102 arranged on the substrate 100. The transmission lines 102 include a conductive material, and are operative to transmit RF signals as indicated by the arrows 101. A plurality of conductive vias 104 that are connected to ground is arranged between the transmission lines 102. The conductive vias 104 are sized and spaced such that RF signals in a particular range of frequencies do not pass through the arrangement of conductive vias 104. The spatial distance (a) between the conductive vias 104 is partially dependent on the frequency of the propagated RF signals. In this regard, a device designed to propagate a higher frequency RF signal would have more conductive vias 104 spaced at a smaller distance than a device designed to propagate a relatively lower frequency RF signal.

FIG. 2 illustrates a side cut-away view of the prior art example along the line 2 of FIG. 1. Referring to FIG. 2, the transmission lines 102 are disposed on the substrate 100 that include a dielectric material. The transmission lines 102 are capped with a capping layer 202 that includes an insulator material. A first conductive layer 204 is arranged on the capping layer 202 and a second conductive layer 206 is arranged on an opposing surface of the substrate 100. The conductive via 104 is communicative through the substrate 100 and the capping layer and is electrically connected to the first conductive layer 204 and the second conductive layer 206. The first conductive layer 204 and the second conductive layer 206 are connected to ground such that the conductive vias 104 are grounded.

SUMMARY

According to one embodiment of the present invention, a radio frequency (RF) device includes a transmission line arranged on a substrate, the transmission line operative to propagate an RF signal having a wavelength ($\lambda$), and a first isolation portion arranged on the substrate proximate to the transmission line, the first isolation portion including an arrangement of stubs, where each stub of the arrangement of stubs has a length (y) where $y=\frac{1}{4}\lambda$, the first isolation portion operative to substantially prevent electromagnetic interference caused by the propagation of the RF signal in the transmission line from passing through the first isolation portion.

According to another embodiment of the present invention, a radio frequency (RF) device includes a transmission line arranged on a substrate, the transmission line operative to propagate an RF signal having a wavelength ($\lambda$), a first isolation portion arranged on the substrate proximate to the transmission line, the first isolation portion including an arrangement of stubs, where each stub of the arrangement of stubs has a length (y) where $y=\frac{1}{4}\lambda$, the first isolation portion operative to substantially prevent electromagnetic interference caused by the propagation of the RF signal in the transmission line from passing through the first isolation portion, and a capping layer disposed over the substrate, the transmission line, and the first isolation portion.

According to yet another embodiment of the present invention, a method for fabricating a radio frequency (RF) device includes determining a wavelength ($\lambda$) of an RF signal that will propagate through a transmission line, calculating a length (y) of a stub portion of an isolator portion where $y=\frac{1}{4}\lambda$, depositing a layer of conductive material on a substrate, patterning the layer of conductive material to form the transmission line and an isolator portion comprising a plurality of the stub portions arranged proximate to the transmission line, depositing a capping layer on exposed portions of the substrate, the transmission line, and the isolator portion.

Additional features and advantages are realized through the techniques of the present embodiments. Other embodiments and aspects of the embodiments are described in detail herein and are considered a part of the claimed embodiments. For a better understanding of the embodiments with the advantages and the features, refer to the description and to the drawings.

BRIEF DESCRIPTION OF THE SEVERAL VIEWS OF THE DRAWINGS

The subject matter which is regarded as the embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

Figure 1:
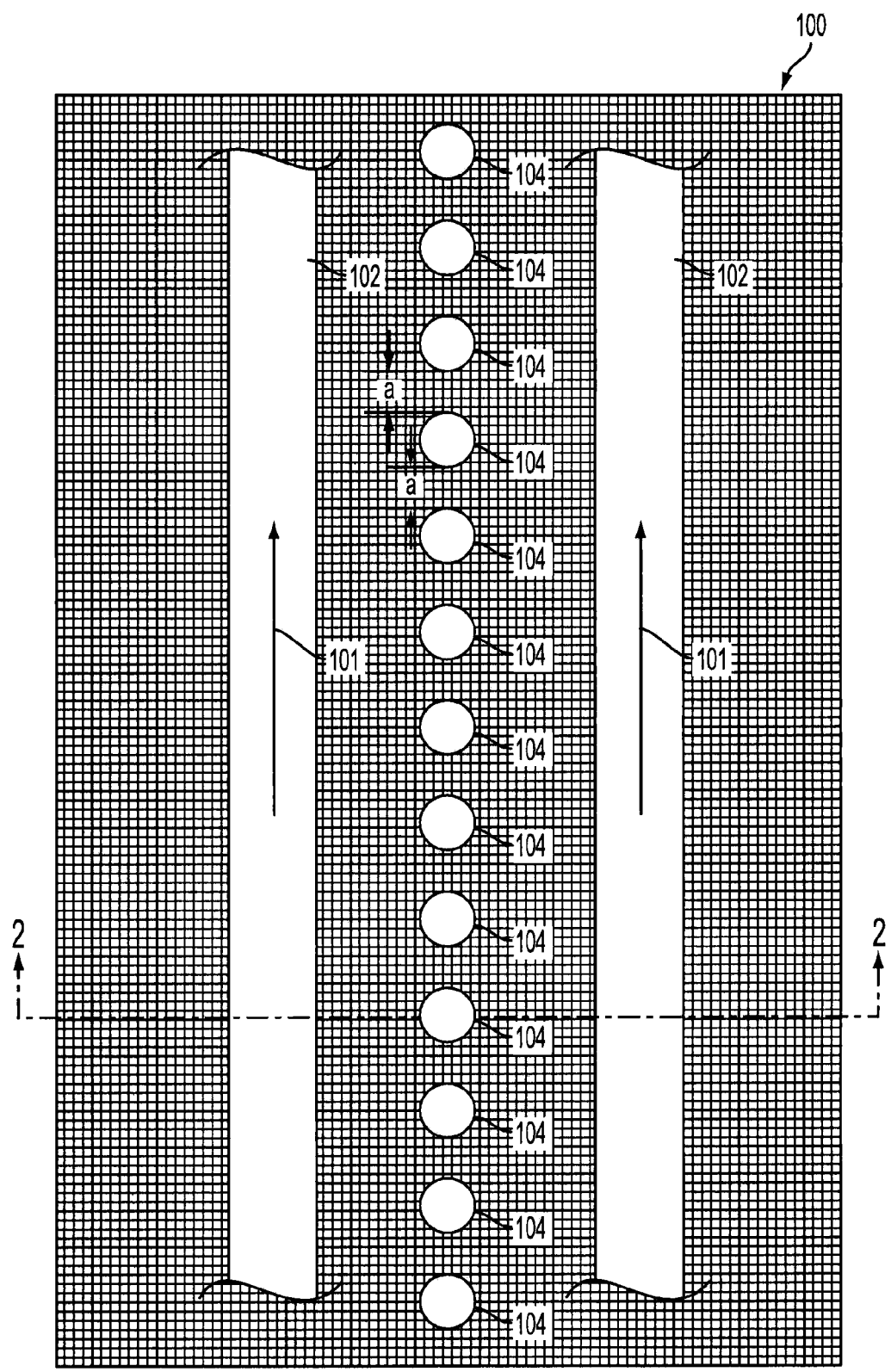
FIG. 1 illustrates top view partially cut-away view of a prior art example of a portion of an RF device arranged on a substrate.
Figure 2:
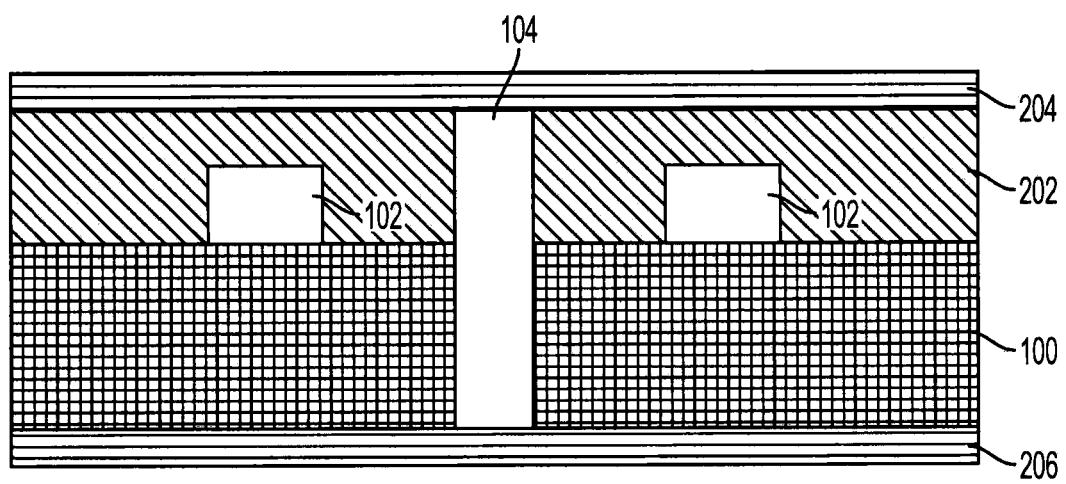
FIG. 2 illustrates a side cut-away view of the prior art example along the line 2 of FIG. 1.

As discussed in reference to the prior art FIGS. 1 and 2 above, the conductive vias 104 pass through the substrate 100. The conductive vias 104 are formed by removing material completely through the substrate 100, thereby reducing the mechanical integrity of the substrate. As discussed above, if the frequency of the transmitted RF signals is increased, the spacing of the conductive vias 104 is reduced. Since each conductive via 104 adversely impacts the integrity of the substrate 100, if too many conductive vias are arranged in close proximity to each other, the substrate may be easily broken due to a lack of sufficient substrate material disposed between adjacent conductive vias 104. Thus, relying on the use of conductive vias 104 to isolate the RF transmission lines from proximate features arranged on the substrate becomes problematic due to the resultant tight spacing of the conductive vias 104 when the frequencies of the propagated RF signals are relatively high.

Figure 3:
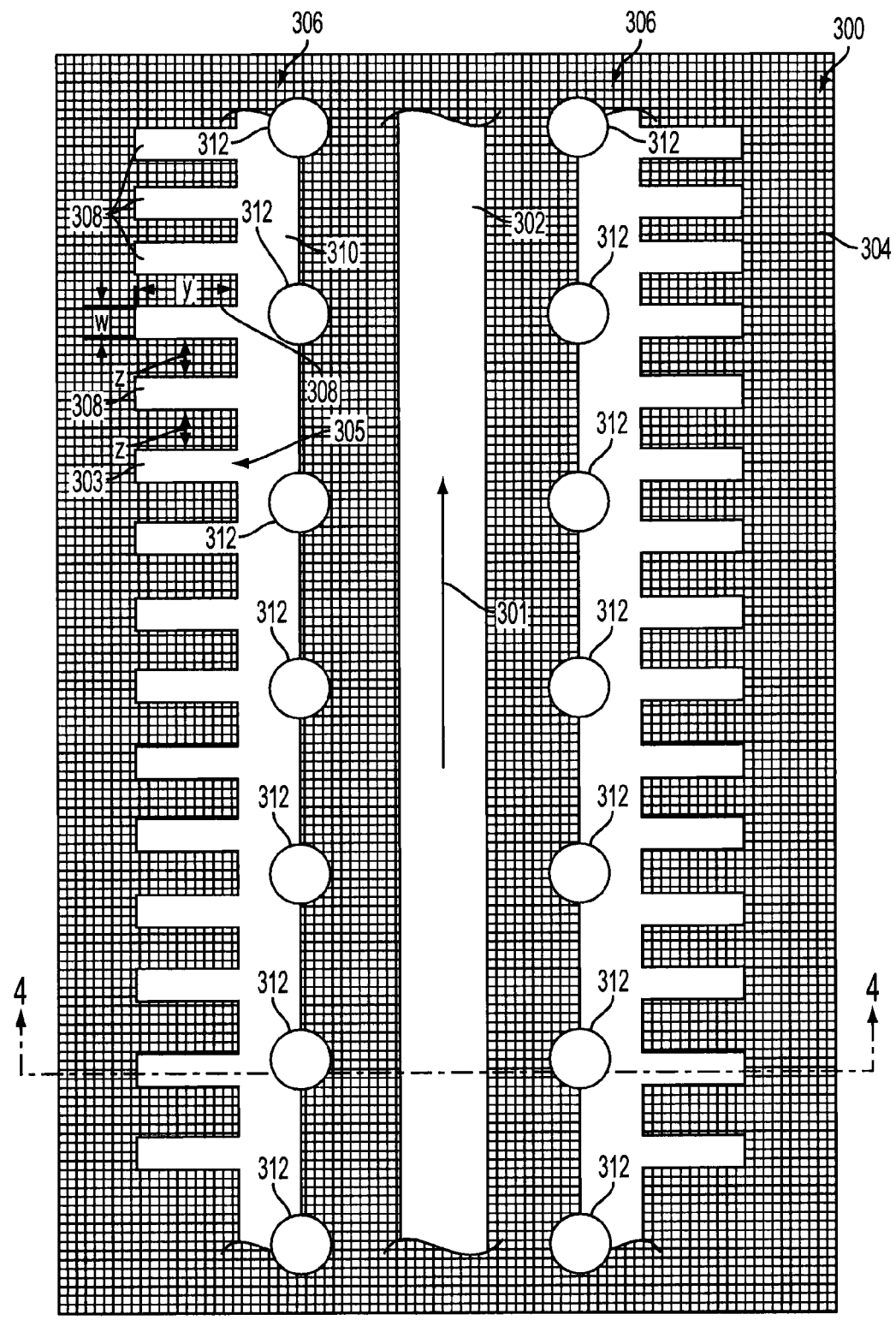
FIG. 3 illustrates an exemplary embodiment of a portion of an RF device.

FIG. 3 illustrates an exemplary embodiment of a portion of an RF device 300 that includes an RF transmission line 302 arranged on a substrate 304. The device 300 includes RF isolator portions 306 arranged proximate to and on opposing sides of the RF transmission line 302. Substrate 304 includes, for example, a dielectric material. The RF transmission line 302 includes a conductive material such as, for example, copper, gold, or aluminum patterned on the substrate 304. The RF isolator portions 306 include a conductive material patterned on the substrate 304 and may include a similar or material as the RF transmission line 302. The device 300 also includes an arrangement of conductive vias 312. The conductive vias 312 are connected to ground and provide RF isolation of the RF interference from emanating from the RF transmission line 302.

The RF isolator portions 306 include an arrangement of stubs 308 extending from a body portion 310 arranged proximate to the RF transmission line 302. Each of the stubs 308 has a length (y) and a width (w), and are spaced at a distance (z). The dimensions of the stubs 308 are determined during the design of the device 300. In this regard, the wavelength (λ) of the RF signal propagating in the RF transmission line 302 indicated by the line 301 is used to determine the length of the stubs 308, which are ¼λ, thus y=¼λ. The spacing distance z is greater than the width w, but is less than ¼λ. The stubs 308 are operative to receive and propagate RF interference from the RF signal propagating in the RF transmission line 302 the distal end 303 of the stubs 308 is operative to reflect the RF interference. The ¼λ length of the stubs results in an apparent short in the impedance of the stubs 308 in the opposing distal end 305. The apparent short effectively prevents RF interference from emanating from the RF transmission line 302 past the isolator portion 306 (for RF signals having a wavelength λ and stubs 308 having a length ¼λ). In this regard, $$\lambda = \frac{c}{f(\sqrt{\varepsilon_e})};$$

where C is the speed of light ($3\times10^8$ m/s), f is the frequency in Hz. $\varepsilon_e$ is determined by the transmission line architecture for example, a microstrip transmission line architecture (i.e. no capping layer) is defined as follows:

when $$\left(\frac{W}{H}\right) < 1;$$

$$\varepsilon_e = \frac{\varepsilon_r+1}{2} + \frac{\varepsilon_r-1}{2}\left[\left(1+12\left(\frac{H}{W}\right)\right)^{-\frac{1}{2}} + .004\left(1-\left(\frac{W}{H}\right)\right)^2\right];$$

when $$\left(\frac{W}{H}\right) \geq 1;$$

$$\varepsilon_e = \frac{\varepsilon_r+1}{2} + \frac{\varepsilon_r-1}{2}\left(1+12\left(\frac{H}{W}\right)\right)^{-\frac{1}{2}};$$

where W is the width of the stub 308, H is the height of the substrate 304; $\varepsilon_e$ is the effective permittivity and $\varepsilon_r$ is the relative permeability.

In some exemplary embodiments a capping layer having a similar geometry and dielectric constant as the substrate 304 may be used. The effective permittivity in such embodiments is equal to the relative permittivity of the substrate. In this regard, $\varepsilon_e=\varepsilon_r$.

Figure 4:
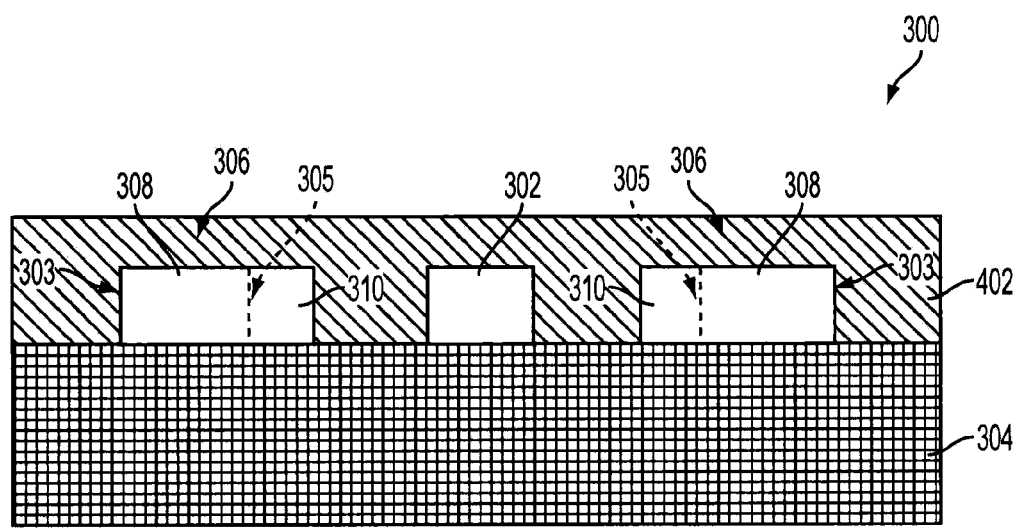
FIG. 4 illustrates a side cut-away view of the device along the line 4 of FIG. 3.

FIG. 4 illustrates a side cut-away view of the device 300 along the line 4 (of FIG. 3). FIG. 4 illustrates the arrangement of the isolator portions 306 having the stubs 308 and the RF transmission line 302 on the substrate 304. A capping layer 402 may be arranged over the substrate 304 and isolator portions 306. The capping layer 402 may include, for example, an insulator material such as, an oxide or nitride material a substrate, or, in some exemplary embodiments, the capping layer 402 may include air (i.e., no capping layer).

Figure 5:
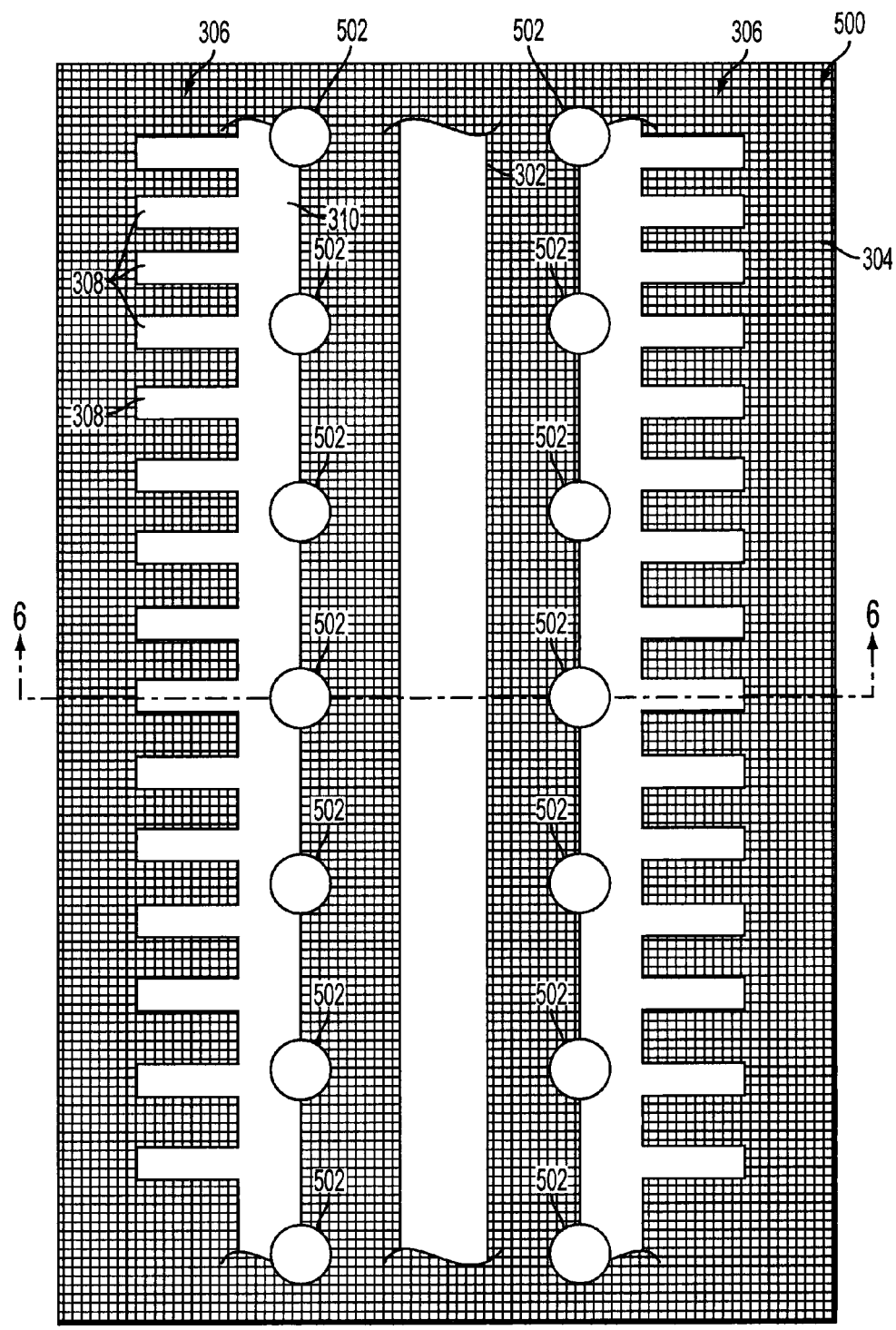
FIG. 5 illustrates an alternate exemplary embodiment of a portion of an RF device.

FIG. 5 illustrates an alternate exemplary embodiment of a portion of an RF device 500. The device 500 includes isolator portions 306 arranged on a substrate 304. The device 500 also includes an arrangement of conductive vias 502. The conductive vias 502 are connected to ground and provide RF isolation of the RF interference from emanating from the RF transmission line 302. The distance (b) between the conductive vias 502 may be selected to provide RF isolation of lower wavelength interference that may emanate from the RF transmission line 302. In this regard, the conductive vias 502 may be sized and arranged to provide RF isolation for a range of particular RF interference emanating from the RF transmission line 302, while the isolator portions 306 may be sized, shaped, and arranged to provide RF isolation for another range of particular RF interference emanating from the RF transmission line 302. Thus, the combination of the isolator portions 306 and the conductive vias 502 may be used in combination to effectively isolate a broad range of RF interference emanating from the RF transmission line 302.

Figure 6:
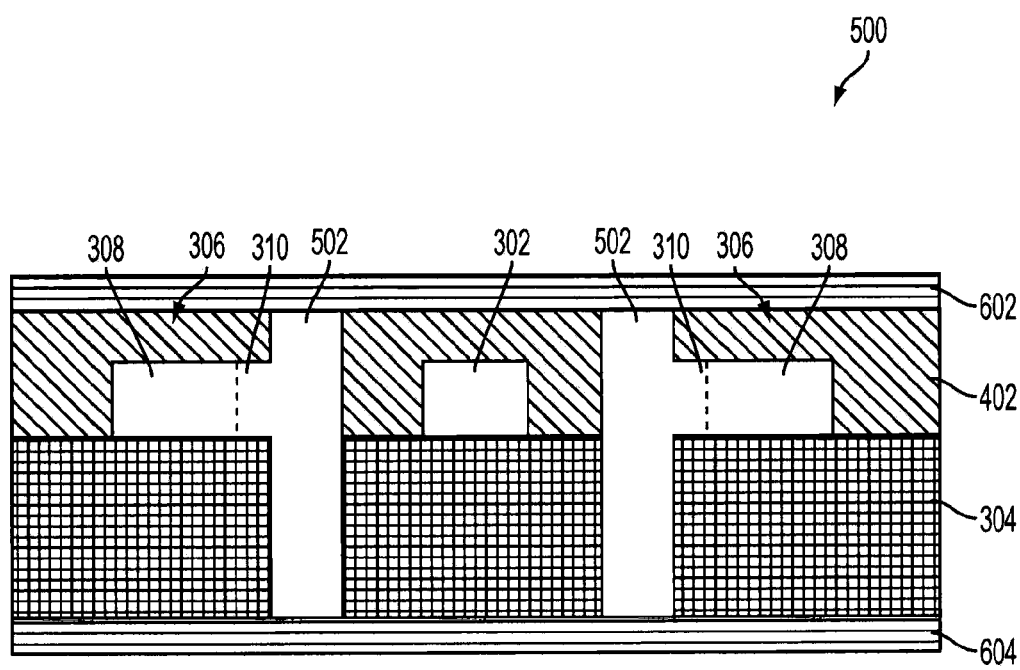
FIG. 6 illustrates a side cut-away view of the device 500 along the line 6 of FIG. 5.

FIG. 6 illustrates a side cut-away view of the device 500 along the line 6 (of FIG. 5). The device 500 includes a capping layer 404, a first conductive layer 602 arranged on the capping layer 404, and a second conductive layer 604 arranged on the opposing surface of the substrate 304. The first conductive layer 602 and the second conductive layer 604 are connected to ground and the conductive vias 502 such that the conductive vias 502 are grounded.

The exemplary embodiment illustrated in FIGS. 5 and 6 may be fabricated by any number of exemplary methods. For example, once the wavelength λ of the RF signal that will be propagated through the RF transmission line 302 is determined, the spacing and size of the conductive vias 502 may be defined. The lengths of the stubs 308 are defined as ¼λ. Once the dimensions and layout of the device 500 is determined, a layer of conductive material may be deposited on the substrate 302 and patterned using, for example, a photolithographic etching process to define the RF transmission line 302 and the isolator portions 306. The capping layer 404 is deposited over the exposed portions of the substrate 304, the RF transmission line 302, and the isolator portions 306 using, for example, an oxidation process, a chemical vapor deposition (CVD) or a plasma enhanced chemical vapor deposition process (PECVD). The vias 502 may be formed by, for example, performing a photolithographic patterning and etching process that removes exposed portions of the capping layer 402 and the substrate 304 to form cavities that are communicative between the capping layer 402 and the substrate 304. The first conductive layer 602 is deposited on the capping layer 404 using for example, suitable deposition process such as, for example, a spin coating process, CVD, PEDVCPECVD. Other fabrication methods may include, for example, a screen printing process to apply traces, or a laser ablation process to remove conductive material from undesired regions. The cavities defining the conductive vias 502 may be filled with the conductive material deposited, for example during the deposition of the first conductive layer 602. The second conductive layer 604 may be deposited on the opposing surface of the substrate 602 using a suitable deposition process. The use of conductive vias 502 with the stubs 308 allows provides for isolation of higher frequency RF interference (isolated by the stubs 308) and lower frequency RF interference (isolated by the conductive vias 502) without spacing the conductive vias 502 in a manner that reduces the structural integrity of the substrate 304 close to the point of structural failure.

Figure 7:
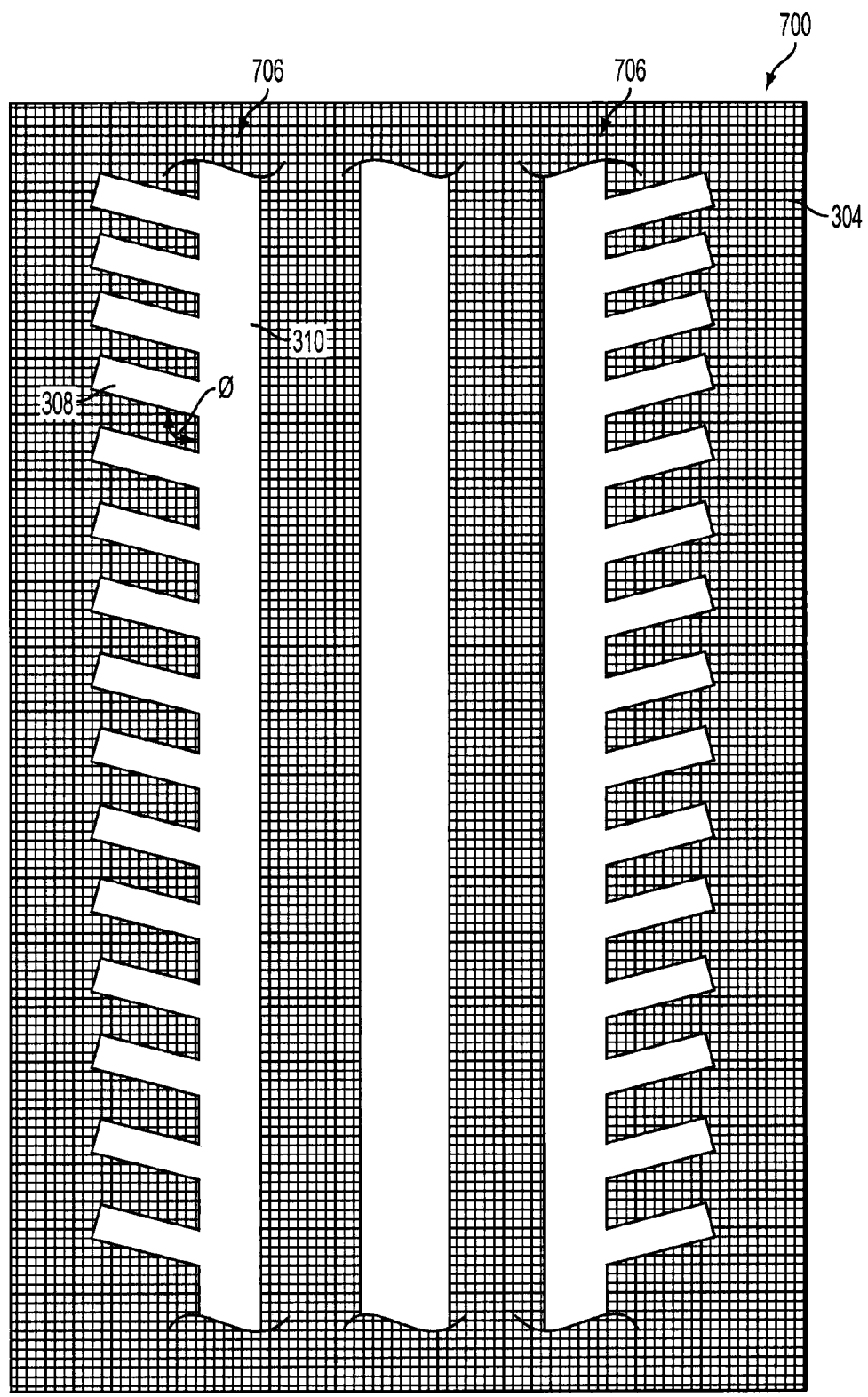
FIG. 7 illustrates another alternate exemplary embodiment of an RF device.

FIG. 7 illustrates another alternate exemplary embodiment of an RF device 700. In the illustrated embodiment, isolator portions 706 include stubs 308 arranged at an oblique angle ($\phi$) relative to the body portion 310. In this regard, the lengths of the stubs 308 are measured along the centerlines of the stubs 308.

Figure 8:
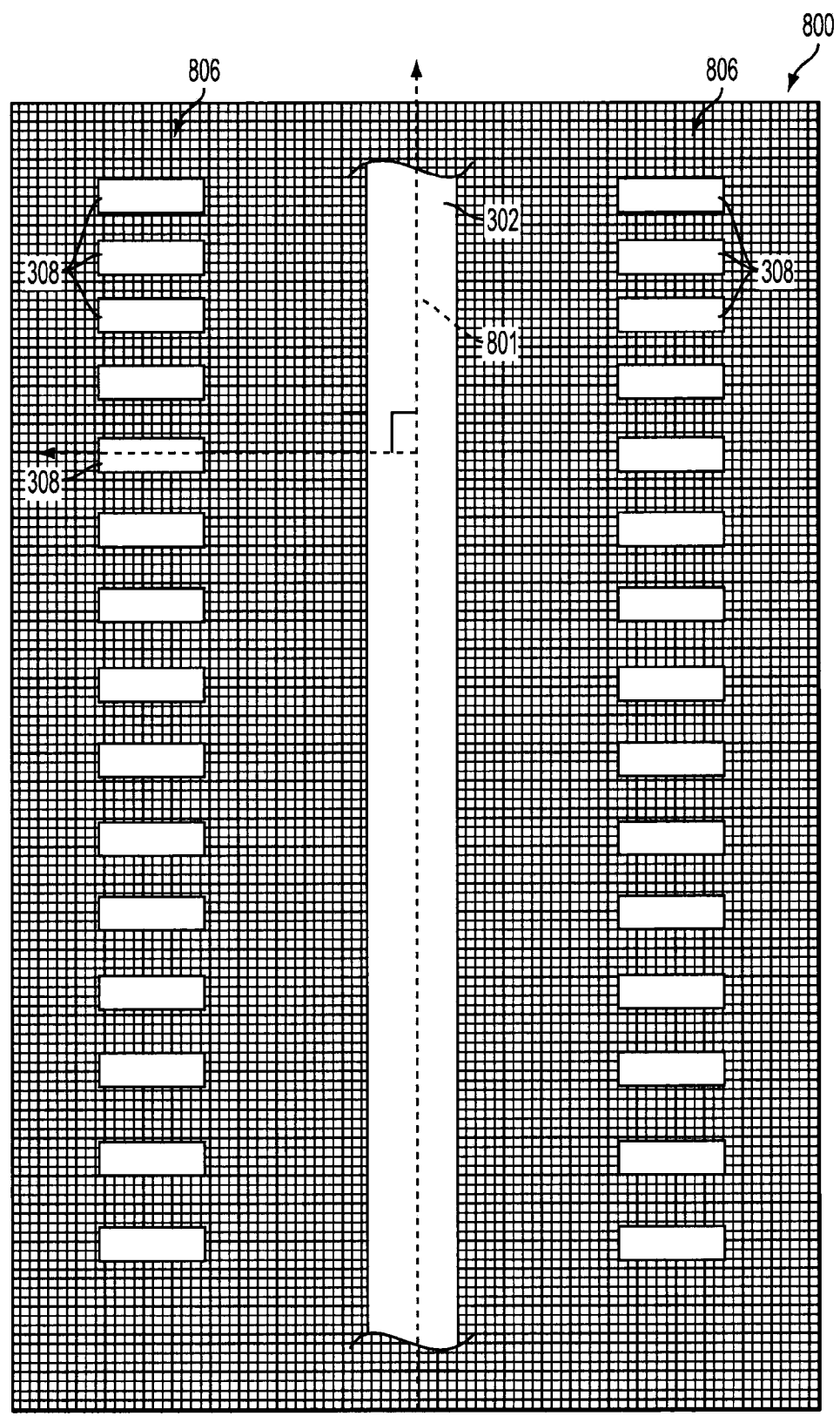
FIG. 8 illustrates another alternate exemplary embodiment of an RF device.

FIG. 8 illustrates another alternate exemplary embodiment of an RF device 800. In the illustrated embodiment, isolator portions 806 do not include a body portion, but rather a plurality of stubs 308 that affect the isolation of the RF signals in a similar manner as described above. In the illustrated embodiment, each of the stubs 308 are arranged at a substantially 90 degree angle relative to a line 801 that defines the path of the transmission line 302. Though the illustrated embodiment includes a transmission line 302 that is substantially straight, alternate embodiments may include a curved transmission line 302. In such embodiments, the stubs 308 may include a linear axis that intersects a line tangential to an edge of the transmission line 302 at a substantially 90 degree angle or at an oblique angle as shown above for example, in FIG. 7.

Figure 9:
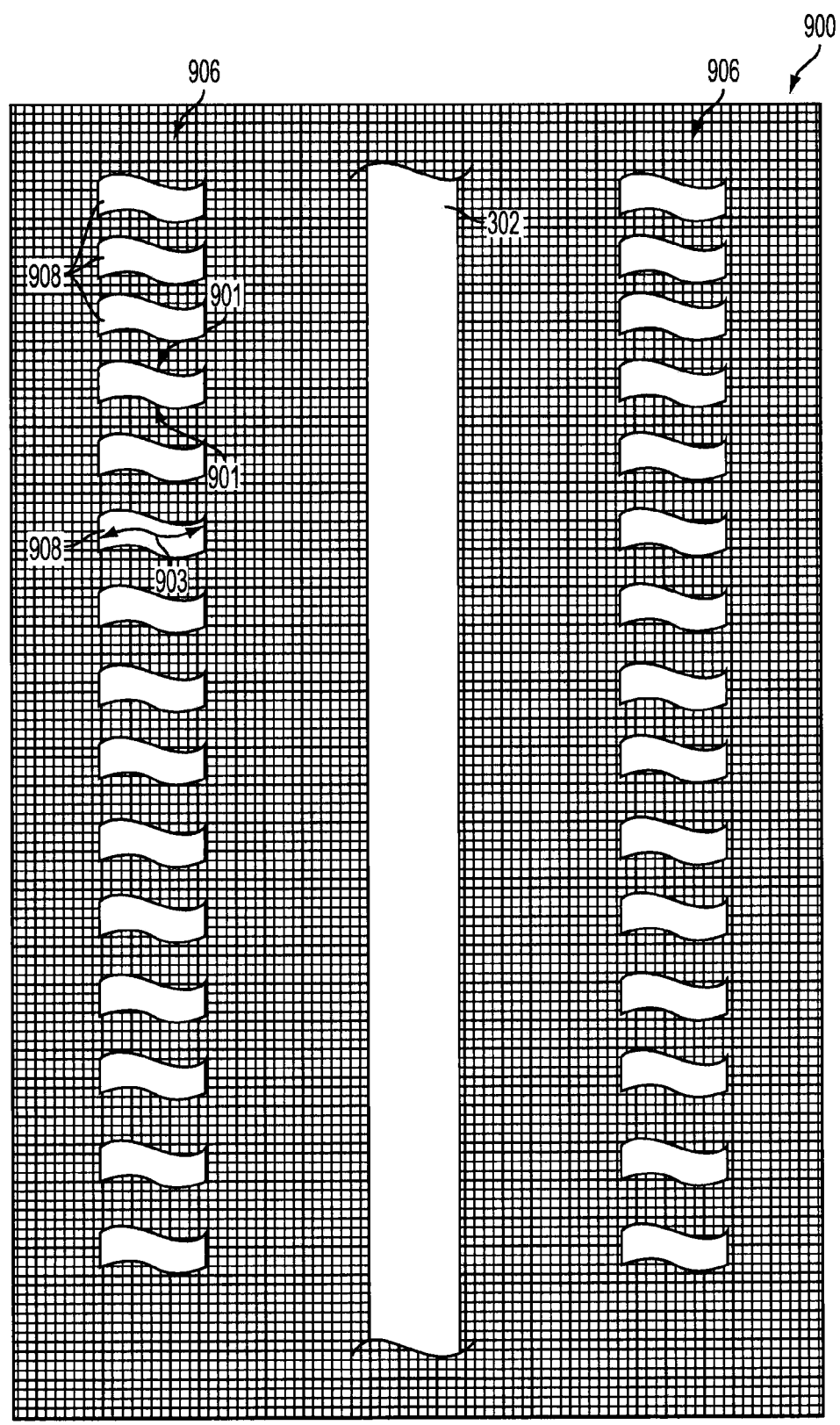
FIG. 9 illustrates another alternate exemplary embodiment of an RF device.

FIG. 9 illustrates another alternate exemplary embodiment of an RF device 900. The device 900 is similar to the embodiments described above, however the isolator portion 906 includes stubs 908 having curved profiles 901. The length of the stubs 908 (i.e., $\frac{1}{4} \lambda$) is distributed along the line 903 that corresponds to the curved profiles 901.

The exemplary embodiments of the isolator portions described above in FIGS. 7, 8, and 9 may be arranged at any suitable angle relative to a body portion 310 and may have any curved or arcuate profiles. The embodiments may or may not include a body portion 310 or portions of a body portion 310. The embodiments may or may not include conductive vias as described above depending on design specifications.

Figure 10:
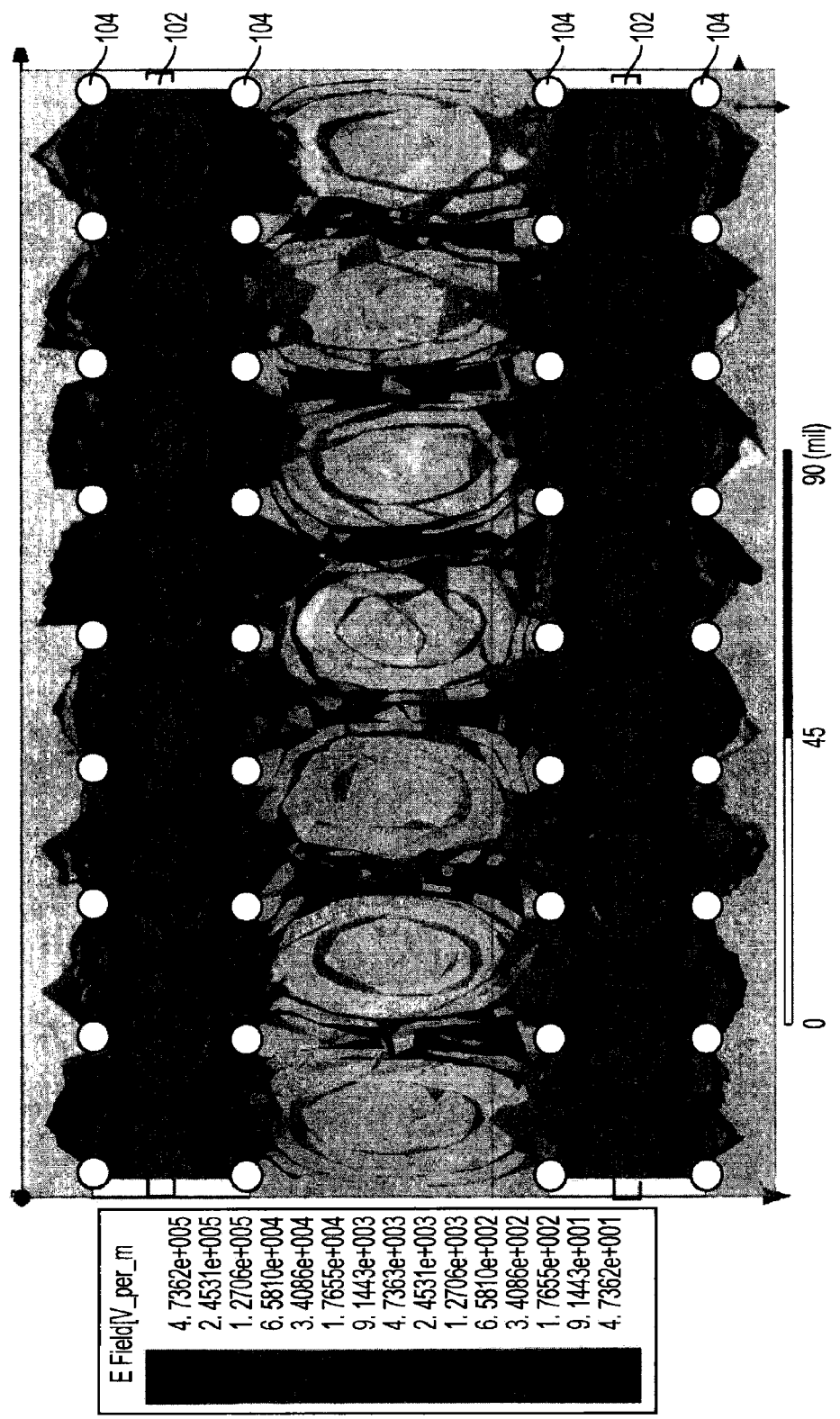
FIG. 10 illustrates a graphical representation of simulated test results of a prior art arrangement similar to the arrangement in FIG. 1.

FIG. 10 illustrates a graphical representation of simulated test results of a prior art arrangement similar to the arrangement described above in FIG. 1. FIG. 10 includes a graphical representation of electromagnetic interference represented by the shaded regions, where the undesirable electromagnetic interference passes through the arrangements of conductive vias 104. As discussed above, though reducing the spacing between the conductive vias 104 (and increasing the number of conductive vias 104) may reduce the undesirable electromagnetic interference that passes through the arrangements of conductive vias 104, reducing the spacing may not be practical if the reduction in spacing and the addition of more conductive vias 104 structurally weakens the substrate.

Figure 11:
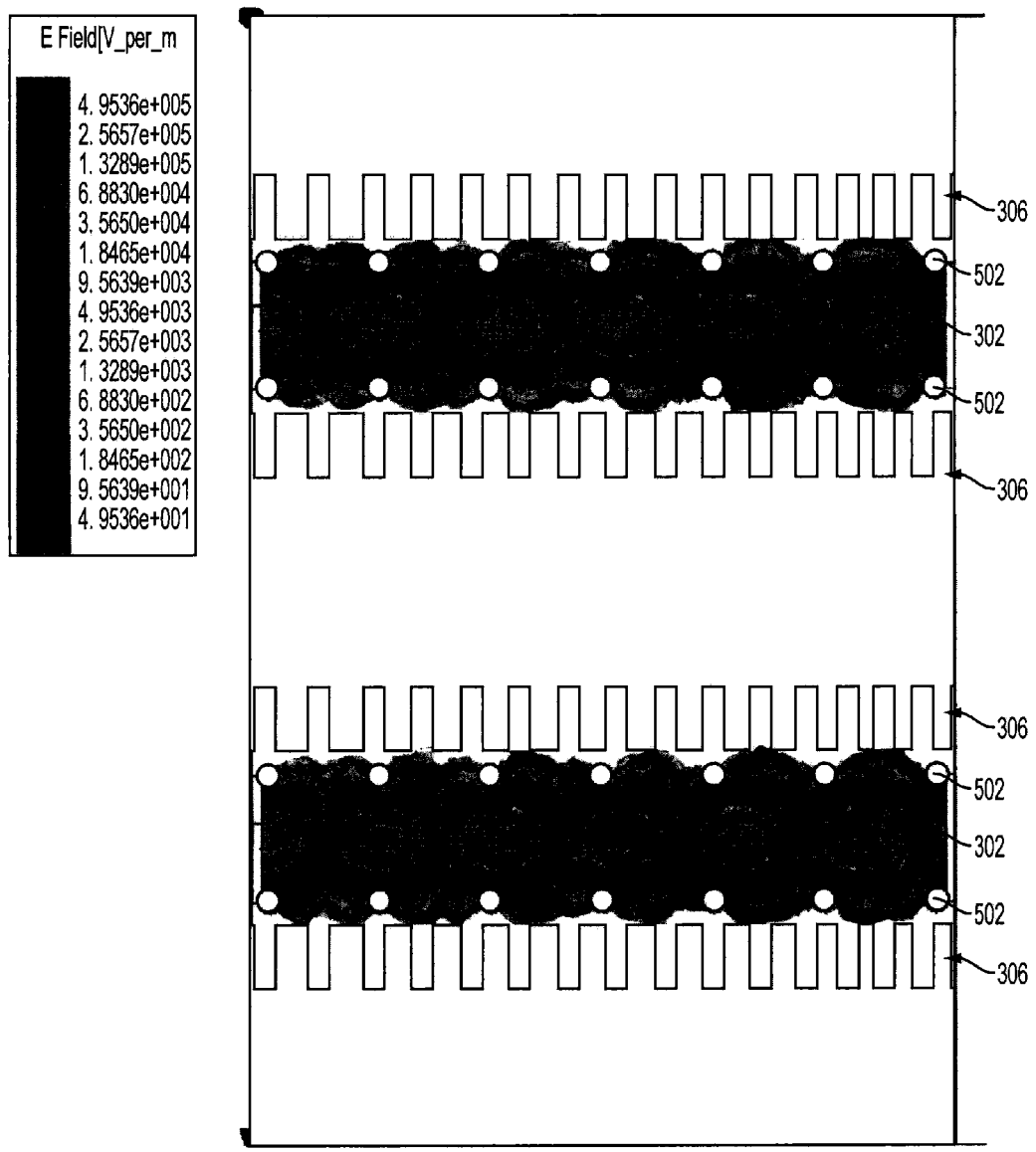
FIG. 11 illustrates a graphical representation of simulated test results of an arrangement similar to the arrangement in FIG. 5.

FIG. 11 illustrates a graphical representation of simulated test results of an arrangement similar to the arrangement described above in FIG. 5. In the illustrated test results, the electromagnetic interference does not pass through the isolator portions 306, thus effectively isolating the RF transmission lines 302, where the electromagnetic interference is illustrated by shaded regions that do not pass through the isolator portions 306.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the embodiments for various embodiments with various modifications as are suited to the particular use contemplated.

The diagrams depicted herein are just one example. There may be many variations to this diagram or the steps (or operations) described therein without departing from the spirit of the embodiments. For instance, the steps may be performed in a differing order or steps may be added, deleted or modified. All of these variations are considered a part of the claimed embodiments.

While the preferred embodiment to the embodiments had been described, it will be understood that those skilled in the art, both now and in the future, may make various improvements and enhancements which fall within the scope of the claims which follow. These claims should be construed to maintain the proper protection for the embodiments first described.

What is claimed is:
1. A radio frequency (RF) device comprising:
   a transmission line arranged on a substrate, the transmission line operative to propagate an RF signal having a wavelength ($\lambda$); and
   a first isolation portion arranged on the substrate proximate to the transmission line, the first isolation portion including an arrangement of stubs, where each stub of the arrangement of stubs has a length (y) where y=¼ $\lambda$ and with each stub portion being electrically isolated from the transmission line, the first isolation portion operative to substantially prevent electromagnetic interference caused by the propagation of the RF signal in the transmission line from passing through the first isolation portion.

2. The device of claim 1, wherein the transmission line includes a conductive material.

3. The device of claim 1, wherein each stub of the arrangement of stubs includes a conductive material.

4. The device of claim 1, wherein the first isolation portion includes a body portion arranged on the substrate proximate to the transmission line.

5. The device of claim 4, wherein the arrangement of stubs extends outwardly from the body portion.

6. The device of claim 4, wherein the body portion includes a conductive material.

7. The device of claim 1, wherein each stub of the arrangement of stubs includes a rectangular shape.

8. The device of claim 1, wherein each stub of the arrangement of stubs is arranged with a longitudinal axis that intersects a line tangential to an edge of the transmission line at a substantially 90 degree angle.

9. The device of claim 1, further comprising a second isolation portion including an arrangement of stubs, where each stub of the arrangement of stubs has a length (y) where $y=\frac{1}{4}\lambda$, arranged on the substrate proximate to the transmission line.

10. A radio frequency (RF) device, comprising:
   a transmission line arranged on a substrate, the transmission line operative to propagate an RF signal having a wavelength ($\lambda$); and
   a first isolation portion arranged on the substrate proximate to the transmission line, the first isolation portion including an arrangement of stubs, where each stub of the arrangement of stubs has a length (y) where $y=\frac{1}{4}\lambda$ the first isolation portion operative to substantially prevent electromagnetic interference caused by the propagation of the RF signal in the transmission line from passing through the first isolation portion;
   wherein each stub of the arrangement of stubs is arranged with a longitudinal axis that intersects a line tangential to an edge of the transmission line at an oblique angle.

11. A radio frequency (RF) device, comprising:
   a transmission line arranged on a substrate, the transmission line operative to propagate an RF signal having a wavelength ($\lambda$);
   a first isolation portion arranged on the substrate proximate to the transmission line, the first isolation portion including an arrangement of stubs, where each stub of the arrangement of stubs has a length (y) where $y=\frac{1}{4}\lambda$ the first isolation portion operative to substantially prevent electromagnetic interference caused by the propagation of the RF signal in the transmission line from passing through the first isolation portion; and
   an arrangement of conductive vias passing through the substrate proximate to the transmission line, wherein each via of the arrangement of vias is spaced from an adjacent via a distance operative to prevent electromagnetic interference from passing through the arrangement of vias.

12. A radio frequency (RF) device comprising:
   a transmission line arranged on a substrate, the transmission line operative to propagate an RF signal having a wavelength ($\lambda$);
   a first isolation portion arranged on the substrate proximate to the transmission line, the first isolation portion including an arrangement of stubs, where each stub of the arrangement of stubs has a length (y) where $y=\frac{1}{4}\lambda$ and with each stub portion being electrically isolated from the transmission line, the first isolation portion operative to substantially prevent electromagnetic interference caused by the propagation of the RF signal in the transmission line from passing through the first isolation portion; and
   a capping layer disposed over the substrate, the transmission line, and the first isolation portion.

13. The RF device of claim 12, further comprising a first conductive layer disposed on a portion of the capping layer, and a second conductive layer disposed on an opposing surface of the substrate.

14. A radio frequency (RF) device, comprising:
   a transmission line arranged on a substrate, the transmission line operative to propagate an RF signal having a wavelength ($\lambda$);
   a first isolation portion arranged on the substrate proximate to the transmission line, the first isolation portion including an arrangement of stubs, where each stub of the arrangement of stubs has a length (y) where $y=\frac{1}{4}\lambda$ the first isolation portion operative to substantially prevent electromagnetic interference caused by the propagation of the RF signal in the transmission line from passing through the first isolation portion; and
   a capping layer disposed over the substrate, the transmission line, and the first isolation portion; and
   an arrangement of conductive vias electrically connected to the first conductive layer and the second conductive layer, each conductive via of the arrangement of conductive vias passes through the capping layer and the substrate.

15. The RF device of claim 14, wherein the vias are electrically connected to ground.

16. The RF device of claim 14, wherein each via of the arrangement of vias is spaced from an adjacent via a distance operative to prevent electromagnetic interference from passing through the arrangement of vias.

17. A method for fabricating a radio frequency (RF) device, the method comprising:
   depositing a layer of conductive material on a substrate;
   patterning the layer of conductive material to form a transmission line configured to transmit an RF signal having a wavelength ($\lambda$), and to form an isolator portion comprising a plurality of the stub portions arranged proximate to the transmission line, each stub portion having a length (y) where $y=\frac{1}{4}\lambda$ with each stub portion being electrically isolated from the transmission line;
   depositing a capping layer on exposed portions of the substrate, the transmission line, and the isolator portion.

18. The method of claim 17, wherein the isolation portion is operative to substantially prevent electromagnetic interference caused by the propagation of the RF signal in the transmission line from passing through the isolation portion.

19. A method for fabricating a radio frequency (RF) device, the method comprising:
   depositing a layer of conductive material on a substrate;
   patterning the layer of conductive material to form a transmission line configured to transmit an RF signal having a wavelength ($\lambda$), and to form an isolator portion comprising a plurality of stub portions arranged proximate to the transmission line, each stub portion having a length (y) where $y=\frac{1}{4}\lambda$;
   depositing a capping layer on exposed portions of the substrate, the transmission line, and the isolator portion;
   etching to remove portions of the capping layer and the substrate to define a plurality of cavities communicative with a surface of the capping layer and an opposing surface of the substrate;
   depositing a first conductive layer on the opposing surface of the substrate; and depositing a second conductive layer on the capping layer in the plurality of cavities to fill the plurality of cavities.

20. The method of claim 19, wherein the filled plurality of cavities defines an arrangement of conductive vias passing through the substrate proximate to the transmission line, wherein each via of the arrangement of vias is spaced from an adjacent via a distance operative to prevent electromagnetic interference from passing through the arrangement of vias.

* * * * *